(12) United States Patent
Cheng et al.

(10) Patent No.: US 9,725,299 B1
(45) Date of Patent: Aug. 8, 2017

(54) MEMS DEVICE AND MULTI-LAYERED STRUCTURE

(71) Applicant: TAIWAN SEMICONDUCTOR MANUFACTURING COMPANY LTD., Hsinchu (TW)

(72) Inventors: Chun-Wen Cheng, Hsinchu County (TW); Jiou-Kang Lee, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/007,762

(22) Filed: Jan. 27, 2016

(51) Int. Cl.
*H01L 29/82* (2006.01)
*B81B 3/00* (2006.01)

(52) U.S. Cl.
CPC .... *B81B 3/0051* (2013.01); *B81B 2201/0235* (2013.01); *B81B 2201/0242* (2013.01); *B81B 2207/07* (2013.01)

(58) Field of Classification Search
CPC .............. B81B 3/0051; B81B 2207/07; B81B 2201/0242; B81B 2201/0235
USPC ................ 257/415, 414, 417, 532, E29.324, 257/E21.002
See application file for complete search history.

(56) References Cited

U.S. PATENT DOCUMENTS

| | | | | |
|---|---|---|---|---|
| 7,605,675 B2 * | 10/2009 | Bar | ..................... | H01H 59/0009 257/415 |
| 2012/0153502 A1 * | 6/2012 | Price | ................... | H01L 21/7688 257/774 |
| 2016/0167945 A1 * | 6/2016 | Chang | ..................... | B81B 3/001 257/415 |
| 2016/0167949 A1 * | 6/2016 | Jiang | ..................... | B81B 7/0048 257/415 |
| 2017/0023606 A1 * | 1/2017 | Naumann | ............. | G01P 15/125 |

* cited by examiner

*Primary Examiner* — Thien F Tran
(74) *Attorney, Agent, or Firm* — WPAT, P.C., Intellectual Property Attorneys; Anthony King

(57) ABSTRACT

A device includes a substrate, a first structure, a second structure, a third structure and a bumper. The first structure is over the substrate. The second structure is over the substrate, wherein the second structure has a first end coupled to the first structure. The third structure is over the substrate, wherein the third structure is coupled to a second end of the second structure. The bumper is between the substrate and the third structure, wherein the bumper is a multi-layered bumper including a first conductive feature, a dielectric feature and a second conductive feature. The dielectric feature is over the first conductive feature. The second conductive feature is over the dielectric feature and electrically connected to the first conductive feature.

20 Claims, 7 Drawing Sheets

MEMS DEVICE AND MULTI-LAYERED STRUCTURE

BACKGROUND

Microelectromechanical Systems (MEMS) device is micro-sized device, normally in a range from less than 1 micron to several millimeters in size. The MEMS device includes mechanical elements (stationary element and/or movable element) to sense a physical condition such as force, acceleration, pressure, temperature or vibration, and electronic elements to process electrical signals. The MEMs devices are widely used in applications such as automotive system, inertial guidance systems, household appliances, protection systems for a variety of devices, and many other industrial, scientific, and engineering systems. Moreover, MEMS applications are extended to optical applications, such as movable mirrors, and radio frequency (RF) applications, such as RF switches.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
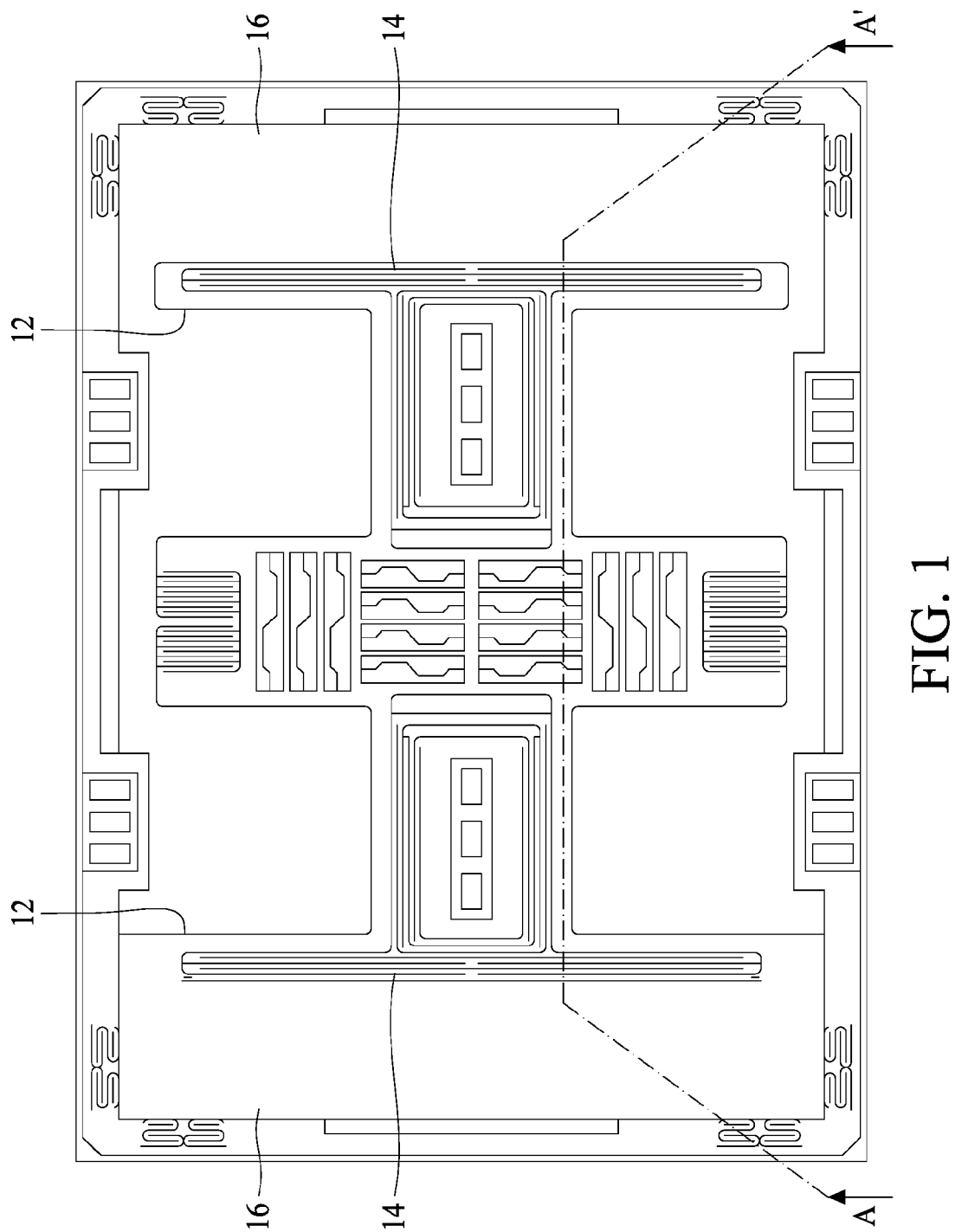
FIG. 1 is a schematic top view of some embodiments of a device.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, a device including a suspended movable structure, a resilient structure and a bumper is provided. The movable structure is suspended from e.g., a substrate with a space such as an air space. The resilient structure is a flexible/elastic structure, which allows extending, compressing, deforming or swinging to a certain degree. One of the ends of the resilient structure is fixed to an object e.g., a substrate or a stationary structure, while another one of the ends is structurally connected to the suspended movable structure in such a manner that the suspended movable structure is able to move, swing or rotate when the device experiences a force, an acceleration, a deceleration, a vibration, an impact or the like. The bumper is disposed adjacent to the movable structure to prevent the movable structure from being broken and/or adhered to the substrate or any structures overlying the substrate.

In the present disclosure, a MEMS device including a spring, a proof mass and a bumper is provided. A portion of the proof mass and the bumper are spaced away, and the proof mass and the bumper are electrically connected to each other. When the proof mass contacts the bumper, electrical charges are equalized.

In the present disclosure, the device includes, but is not limited to, a MEMS device, such as a motion sensor device, an accelerometer device, or a gyroscope device. The suspended movable structure may include a proof mass, a diaphragm, or any other movable structures. The resilient structure may include a spring, or any other resilient structures with resilience.

As used herein, a "substrate" refers to a base material on which various layers and structures are formed. In some embodiments, the substrate includes a semiconductor substrate, such as a bulk semiconductor substrate. By way of example, the bulk semiconductor substrate includes an elementary semiconductor, such as silicon or germanium; a compound semiconductor, such as silicon germanium, silicon carbide, gallium arsenic, gallium phosphide, indium phosphide, or indium arsenide; or combinations thereof. In some embodiments, the substrate includes a multilayered substrate, such as a silicon-on-insulator (SOI) substrate, which includes a bottom semiconductor layer, a buried oxide layer (BOX) and a top semiconductor layer. In still some embodiments, the substrate includes an insulative substrate, such as a glass substrate, a conductive substrate, or any other suitable substrate. In some embodiments, the substrate is a doped semiconductor substrate.

As used herein, "couple to" refers to a structure directly or indirectly contacting another structure.

As used herein, "suspended" refers to a structure disposed above and spaced away from another structure, thereby allowing the structure is able to move in at least one direction with respective to another structure.

As used herein, a "movable structure" refers to a structure that is formed over the substrate or part of the substrate, where some part of the movable structure is directly or indirectly coupled to the a resilient structure, and some part of the movable structure is suspended over the substrate or some part of the substrate with a space therebetween.

Accordingly, the movable structure is able to move or swing when experiencing a force, an acceleration, a deceleration, a vibration, an impact or the like. In some embodiments, the movable structure is conductive. For example, the movable structure includes a semiconductor material e.g., silicon doped with p type or n type dopants. In some embodiments, the movable structure includes a dielectric material and a conductive material enclosing the dielectric material. For example, the dielectric material is silicon or silicon compound, e.g., silicon oxide, and the conductive material is metal. In some embodiments, the movable structure is not conductive.

As used herein, a "resilient structure" refers to a structure that is formed over the substrate or a part of the substrate, where some part of the resilient structure is fixed on the substrate or other fixed structure, and some part of the resilient structure is coupled to the movable structure. The resilient structure is a flexible/elastic structure, which allows extending, compressing, or deforming to a certain degree. In some embodiments, the resilient structure has a winding pattern that allows the resilient structure to extend or compress. In some embodiments, the movable structure has a mass greater than that of the resilient structure, and thus the movable structure is able to move or swing due to inertial effect when experiencing a force, an acceleration, a deceleration, a vibration, an impact or the like. In some embodiments, the resilient structure is conductive. For example, the resilient structure includes a semiconductor material e.g., silicon doped with p type or n type dopants. In some embodiments, the resilient structure includes a dielectric material and a conductive material enclosing the dielectric material. For example, the dielectric material is silicon or silicon compound e.g., silicon oxide, and the conductive material is metal. In some embodiments, the resilient structure is not conductive.

As used herein, a "stationary structure" or a "fixed structure" refers to a structure that is immobile with respect to the movable structure and the resilient structure when experiencing a force, an acceleration, a deceleration, a vibration, an impact or the like. The stationary structure or the fixed structure may be formed directly or indirectly on the substrate, or is a part of the substrate. In some embodiments, the stationary structure is conductive. For example, the stationary structure includes a semiconductor material e.g., silicon doped with p type or n type dopants. In some embodiments, the stationary structure includes a dielectric material and a conductive material enclosing the dielectric material. For example, the dielectric material is silicon, or silicon compound e.g., silicon oxide, and the conductive material is metal. In some embodiments, the stationary structure is not conductive.

As used herein, "monolithically formed" refers to two or more structures are formed of the same material(s) and simultaneously. By way of example, two or more structures are formed by the same lithography.

As used herein, a "bumper" is a structure configured as a buffer to reduce damage in a collision and to avoid undesired adhesion. The bumper is disposed adjacent to the movable structure and in a path where the movable structure may reach.

Figure 1A:
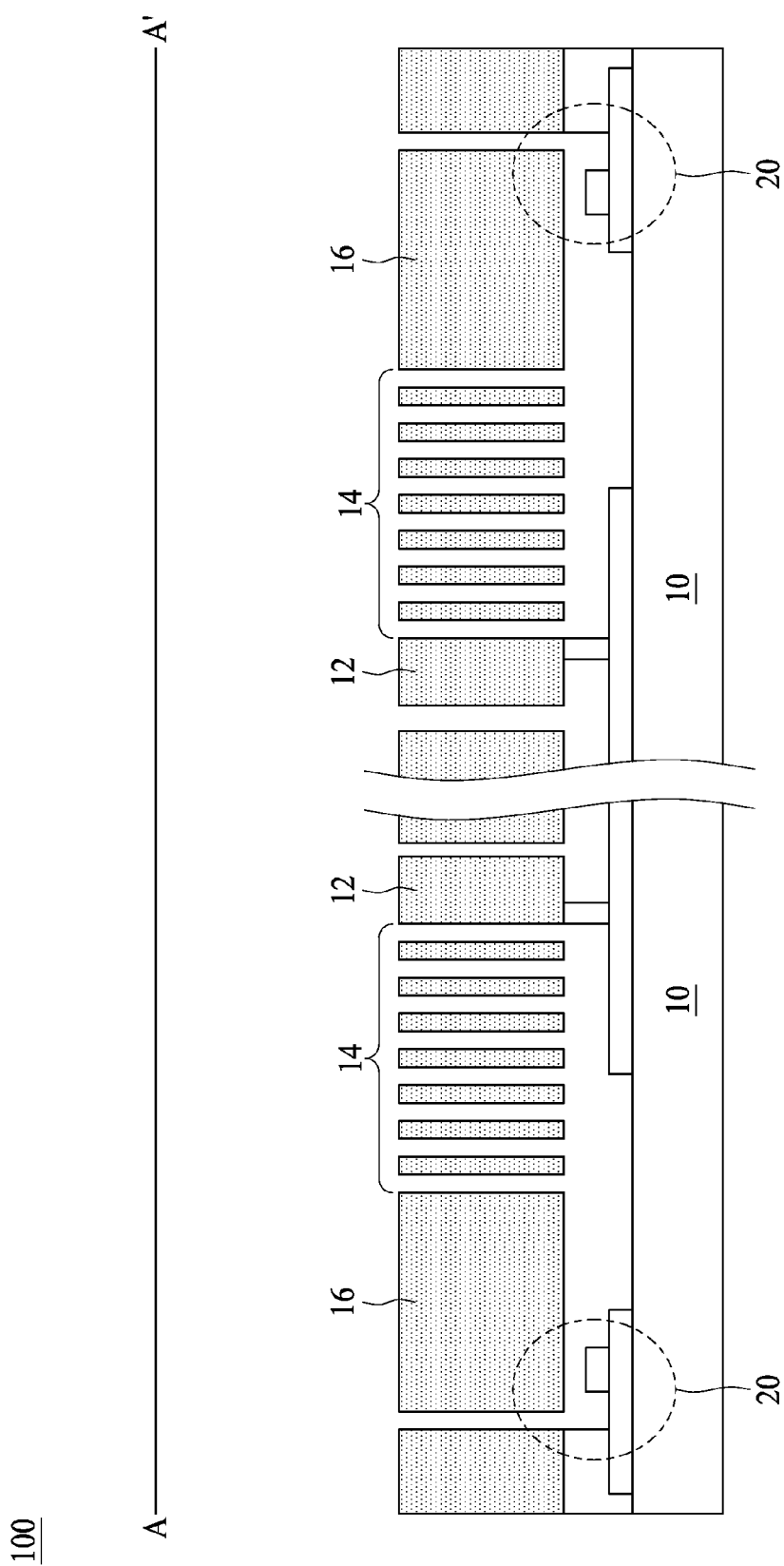
FIG. 1A is a schematic cross-sectional view taken along line A-A' of FIG. 1.
Figure 1B:
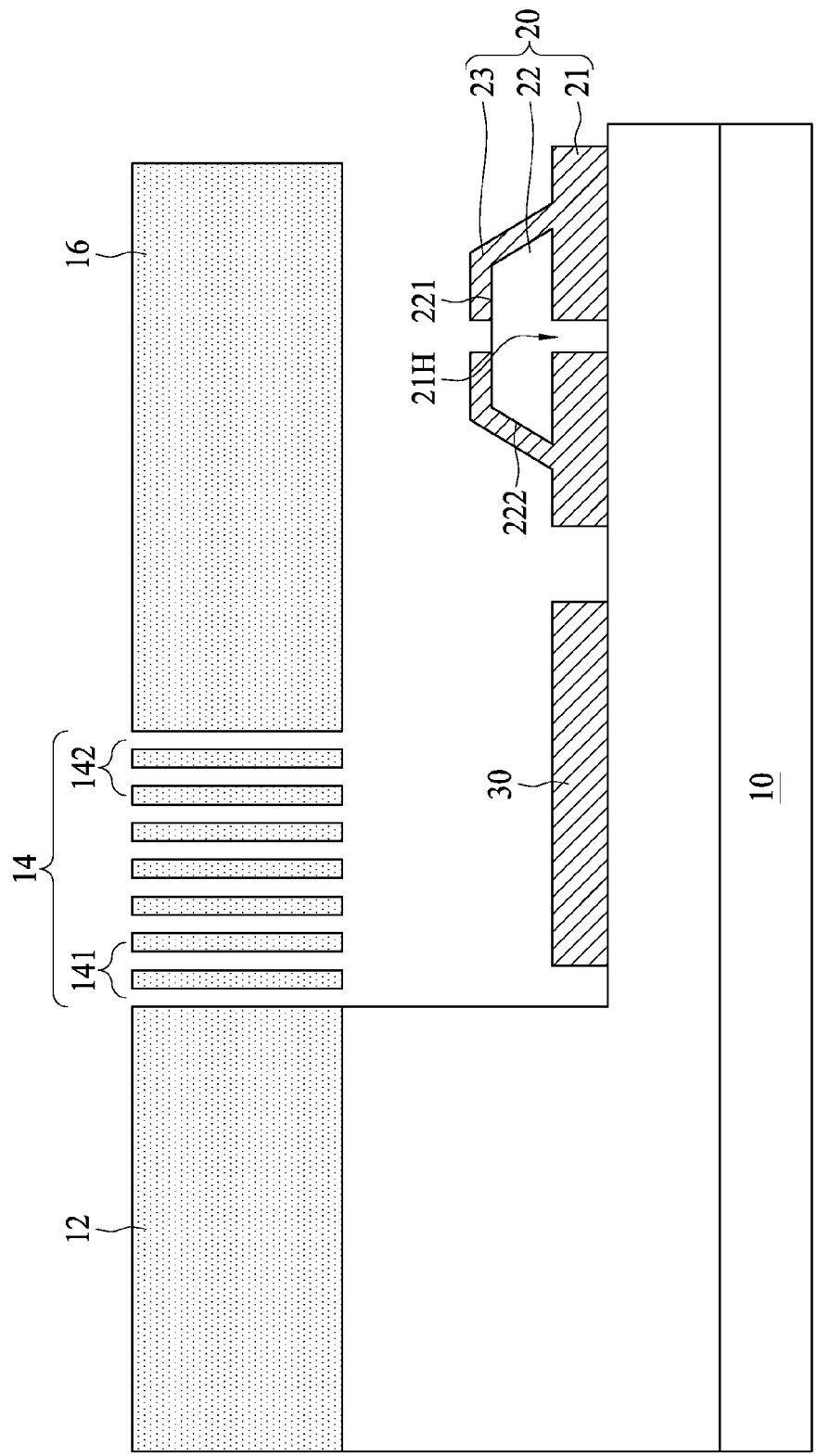
FIG. 1B is an enlarged cross-sectional view of some embodiments of a device corresponding to FIG. 1A.

FIG. 1 is a schematic top view of some embodiments of a device. FIG. 1A is a schematic cross-sectional view taken along line A-A' of FIG. 1. FIG. 1B is an enlarged cross-sectional view of some embodiments of a device corresponding to FIG. 1A. In some embodiments, the device 100 is a MEMS device. By way of example, the MEMS device includes a motion sensor device able to sense motion, an accelerometer device able to sense acceleration or deceleration, a gyroscope device able to sense angular velocity, or any other devices with movable structure. In some embodiments, the device is a single-axis MEMS device able to sense motion, acceleration or angular velocity in one single direction (e.g., Z direction). In some other embodiments, the device is a double-axis MEMS device able to sense motion, acceleration or angular velocity in two directions (e.g., X, Z directions). In still other embodiments, the device is a triple-axis MEMS device able to sense motion, acceleration or angular velocity in three directions (e.g., X, Y, Z directions).

The device 100 includes a substrate 10, a first structure 12, a second structure 14, a third structure 16, and a bumper 20. The first structure 12 is disposed over the substrate 10. In some embodiments, the first structure 12 is a stationary structure fixed on the substrate 10. In some embodiments, the first structure 12 is a semiconductor layer, a stack of semiconductor layer, a dielectric layer, a stack of dielectric layers, or combinations thereof. By way of example, the material of the first structure 12 includes silicon such as polycrystalline silicon. In some other embodiments, the material of the first structure 12 includes silicon oxide, silicon nitride, silicon oxynitride, or the any other suitable materials. The first structure 12 exposes a portion of the substrate 10, or exposes overlying layer(s) of a portion of the substrate 10.

The second structure 14 is disposed over the substrate 10. Specifically, the second structure 14 is suspended over the substrate 10, and spaced away from the substrate 10 with a space e.g., an air space. In some embodiments, the second structure 14 is a resilient structure. The resilient structure is a flexible structure or an elastic structure, which allows extending, compressing or deforming to a certain degree. By way of example, the second structure 14 is a spring. The second structure 14 has a first end (fixed end) 141 which is directly or indirectly coupled to the first structure 12. The second structure 14 has a second end (movable end) which is directly or indirectly coupled to the third structure 16. Specifically, the second structure 14 anchors the third structure 16 to the first structure 12. In some embodiments, a plurality of second structure 14 are coupled to different sides of the first structure 12, or coupled to different first structures 12. In some embodiments, the first structure 12 and the second structure 14 are formed of the same material e.g. polycrystalline silicon or the like, and formed monolithically.

The third structure 16 is over the substrate 10. The third structure 16 is suspended over the substrate 10, and spaced away from the substrate 10 with a gap e.g., an air gap. In some embodiments, the third structure 16 is an inertial structure which has a mass relatively greater than that of the second structure 14. The third structure 16 is a movable structure. By way of example, the third structure 16 is a proof mass. In some embodiments, one end of the third structure 16 is coupled to the second end (movable end) 142 of the second structure 14. In some embodiments, two or more ends of the third structure 16 are coupled to the movable ends of respective second structures 14. The third structure 16 is supported by the second structure 14. The second structure 14 is configured to allow the third structure 16 to move or swing at least in a Z direction (e.g., a direction substantially perpendicular to the upper surface of the substrate 10) due to inertial effect when the device 100 experiences a force, an acceleration, a deceleration, a vibration, an impact or the like. In some embodiments, the first structure 12, the second structure 14 and the third structure 16 are formed of the same material e.g., polycrystalline silicon or the like, and formed monolithically. In some embodiments, the first structure 12, the second structure 14 and the third structure 16 are formed by patterning overlying layer(s) over the substrate 10. In some embodiments, the first structure 12, the second structure 14 and the third structure 16 are formed by patterning the substrate 10, i.e., the first structure 12, the second structure 14 and the third structure 16 are a part of the substrate 10.

In some embodiments, the device 100 further includes a plate 30 of a capacitor over the substrate 10. The plate 30 is conductive plate such as a metal plate. In some embodiments, the plate 30 overlaps a portion of the third structure 16 in the direction Z, thereby forming a capacitor. In some embodiments, the plate 30 overlaps a portion of the second structure 14 in the direction Z. Accordingly, motion, acceleration or angular velocity of the third structure 16 can be sensed e.g., due to a capacitance variation between the plate 30 and the third structure 16.

In some embodiments, the bumper 20 is disposed between the substrate 10 and the third structure 16. The bumper 20 is configured to prevent the third structure 16 from being broken when hitting the substrate 10 or any structures overlying the substrate 10 and adhered to the substrate or any structures overlying the substrate 10. Thus, the bumper 20 is also referred to as a stopper. The bumper 20 is disposed adjacent to the third structure 16, and is in the path where the third structure 16 may reach. In some embodiments, the bumper 20 is disposed on the substrate 10. In some other embodiments, the bumper 20 is disposed over the substrate 10 with intermediate layer(s) disposed therebetween. The bumper 20 is a multi-layered bumper. In some embodiments, the bumper 20 includes a first conductive feature (also referred to as a bottom conductive feature) 21, a dielectric feature 22 and a second conductive feature (also referred to as a top conductive film) 23 stacked to one another. In some embodiments, the first conductive feature 21 is formed on the substrate 10. The dielectric feature 22 is formed over the first conductive feature 21. The second conductive feature 23 is formed over the dielectric feature 22 and electrically connected to the first conductive feature 21. The first conductive feature 21 and the second conductive feature 23 are formed of conductive material such as metal. The first conductive feature 21 and the second conductive feature 23 may be formed of the same material or different materials. The dielectric feature 22 is formed of insulative material such as silicon oxide, silicon nitride, silicon oxynitride, or any other suitable inorganic or organic materials. In some embodiments, the material of the second conductive feature 23 is softer or flexible than that of the dielectric feature 22. In some embodiments, the first conductive feature 21 and/or the second conductive feature 23 can be formed monolithically with the plate 30.

In some embodiments, the first conductive feature 21 has a recess 21H. The dielectric feature 22 is disposed on the first conductive feature 21, and a portion of the dielectric feature 22 is in the recess. In other words, the dielectric feature 22 is engaged with the first conductive feature 21, thereby preventing the dielectric feature 22 from sliding or shifting. The second conductive feature 23 covers at least a portion of the dielectric feature 22. In some embodiments, the dielectric feature 22 has a top surface 221 and a slanted sidewall 222, and the second conductive feature 22 covers the slanted sidewall 222 and a portion of the top surface 221 of the dielectric feature 22. By way of example, the dielectric feature 22 has a trapezoid cross-sectional shape, in which the slanted sidewall 222 is slanted outwardly. The slope of the slanted sidewall 222 may be modified based on different consideration. In some embodiments, the second conductive feature 23 is a conductive film, which surrounds the slanted sidewall 222 and covers a portion of the top surface 221. In some embodiments, the second conductive feature 23 is substantially conformal to the slanted sidewall 222 and/or the top surface 221 of the dielectric feature 22. With the slanted taper profile, the step coverage of the second conductive feature 23 can be improved, thereby increasing adhesion.

The bumper 20 is configured to prevent the third structure 16 from being adhered to the substrate 10 or an overlying layer on the substrate 10 when the device 100 experiences a force, an acceleration, a deceleration, a vibration, an impact or the like in the direction Z. The multi-layered bumper 20 includes soft material such as the second conductive feature 23 and/or the first conductive feature 21, and hard material such as the dielectric feature 22. The second conductive feature 23 and/or the first conductive feature 21 provides a buffer effect when the third structure 16 contacts the bumper 20 so as to avoid generation of particles. The dielectric feature 22 provides a substantive supporting effect when the third structure 16 contacts the bumper 20 so as to avoid stiction. The thickness and the position of the bumper 20 can be modified based on different considerations. For example, the thickness of the bumper 20 is greater than other structure on the substrate e.g., the plate 30. The bumper 20 is disposed at a location where the third structure 16 is expected to contact the substrate 10 or an overlying layer when the third structure 16 moves toward the substrate 10, or at a location where the amplitude of the third structure 16 is maximum when the device 100 experiences a force, an acceleration, a deceleration, a vibration, an impact or the like in the direction Z. In some embodiments, the bumper 20 is disposed corresponding to an end of the third structure 16 distal to the second structure 14. An exemplary operation mechanism of the bumper 20 is explained in the following descriptions.

Figure 2:
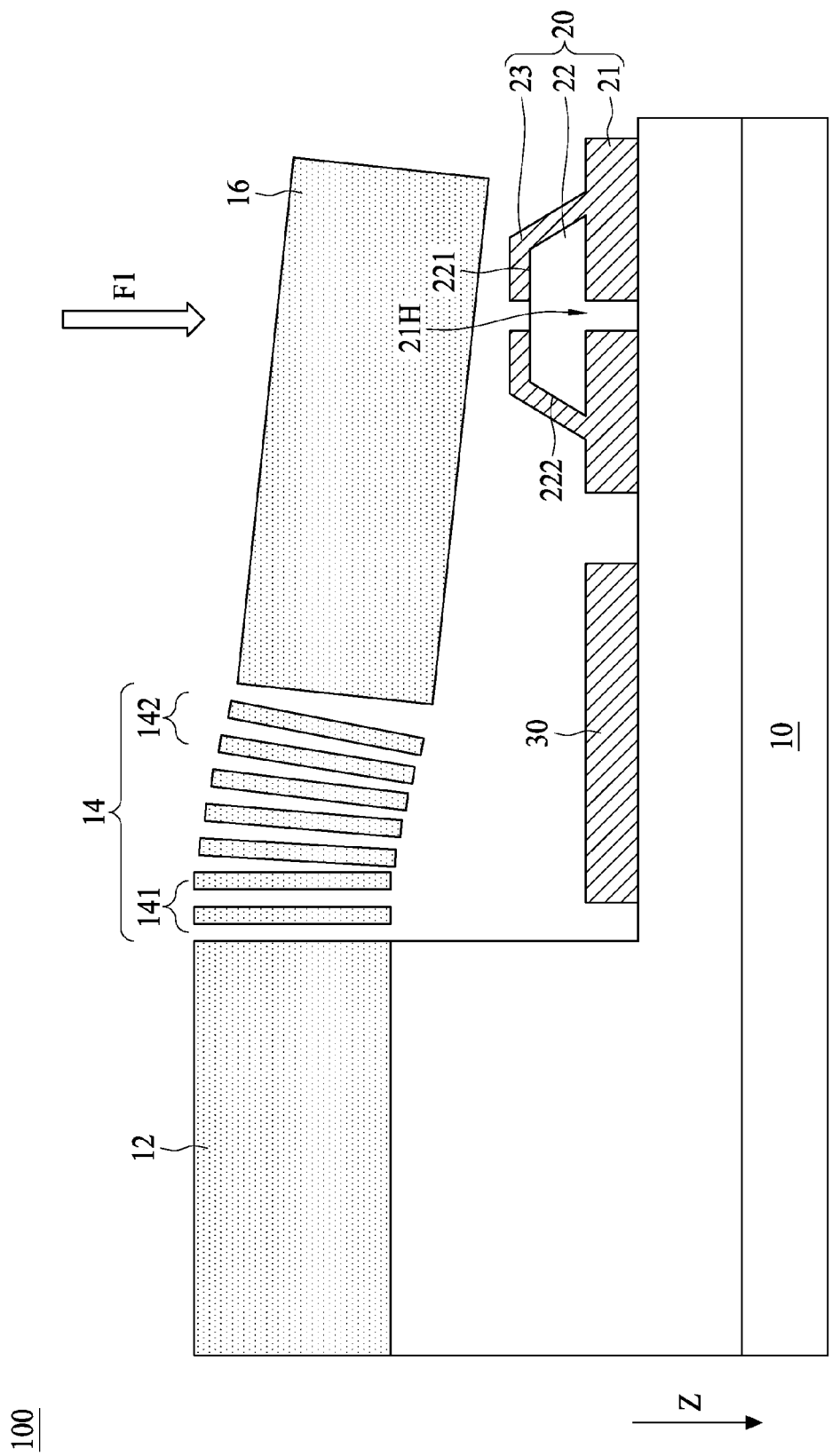
FIG. 2 is a schematic diagram of some embodiments of a device undergone a first force within the maximum force tolerance.

FIG. 2 is a schematic diagram of some embodiments of a device undergone a first force within the maximum force tolerance. As depicted in FIG. 2, when the device 100 experiences a force F1 in direction Z due to a form of shock, both the second structure 14 and the third structure 16 coupled thereto will move or rotate toward the plate 30 along the direction Z due to inertial effect. Accordingly, the motion, acceleration or angular velocity of the third structure 16 can be sensed by detecting a capacitance variation between the third structure 16 and the plate 30. In case the first force F1 does not exceed the maximum force tolerance, the second structure 14 and third structure 16 will move or rotate toward the first structure 12 without contacting the bumper 20, and return to their initial positions.

In some embodiments, the third structure 16 may be attracted by the bumper 20 due to electrical charge accumulation. The bumper 20 may be electrically coupled to a ground terminal or to the third structure 16 to equalize the electrical charge accumulated in the third structure 16 when they are contacted.

Figure 3:
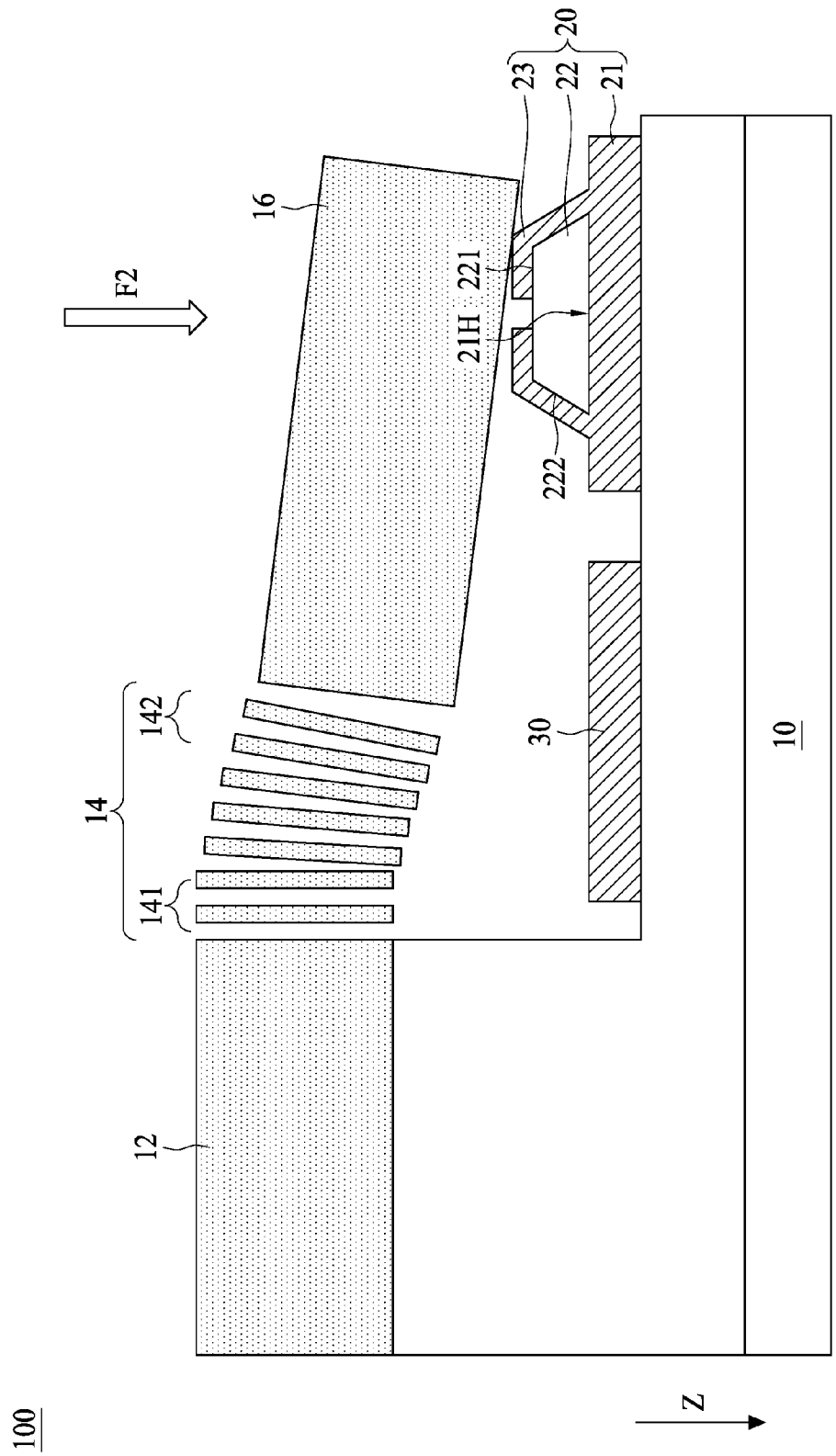
FIG. 3 is a schematic diagram of some embodiments of a device undergone a second force beyond the maximum force tolerance.

FIG. 3 is a schematic diagram of some embodiments of a device undergone a second force beyond the maximum force tolerance. As depicted in FIG. 3, when the device 100 experiences a second force F2 greater than the maximum force tolerance in direction Z due to another form of shock, both the second structure 14 and the third structure 16 coupled thereto will move or rotate toward the plate 30 along the direction Z due to inertial effect. When the second force F2 is excessive, the third structure 16 will contact the multi-layered bumper 20. In such a case, the second conductive feature 23 and/or the first conductive feature 21 provides a buffer effect when the third structure 16 contacts the bumper 20 so as to avoid generation of particles. The dielectric feature 22 provides a substantive supporting effect when the third structure 16 contacts the bumper 20 so as to avoid stiction.

The device of the present disclosure is not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 4:
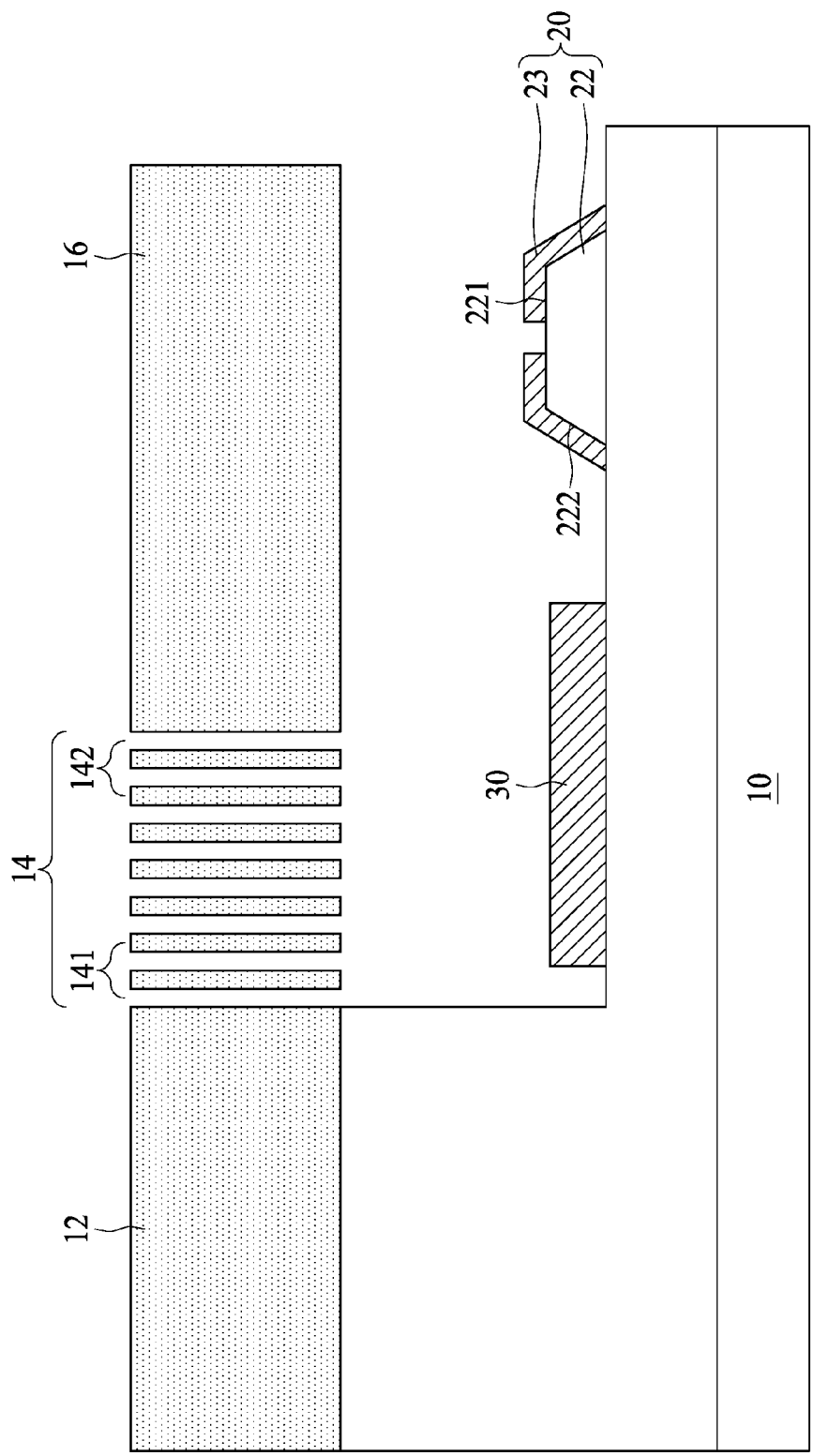
FIG. 4 is a schematic cross-sectional view of some embodiments of a device.

FIG. 4 is a schematic cross-sectional view of some embodiments of a device. As depicted in FIG. 4, one difference between the device 110 and the device 100 is that the first conductive feature 21 of the bumper 20 is omitted. In some embodiments, the bumper 20 of the device 110 includes the dielectric feature 22 and the second conductive feature 23. The second conductive feature 23 covers at least a portion of the dielectric feature 22. In some embodiments, the second conductive feature 22 covers the slanted sidewall 222 and a portion of the top surface 221 of the dielectric feature 22.

When the third structure 16 contacts the multi-layered bumper 20, the second conductive feature 23 21 is able to provide a buffer effect when the third structure 16 contacts the bumper 20, thereby avoiding generation of particles. In addition, the dielectric feature 22 is able to provide a substantive supporting effect, thereby avoiding stiction.

Figure 5:
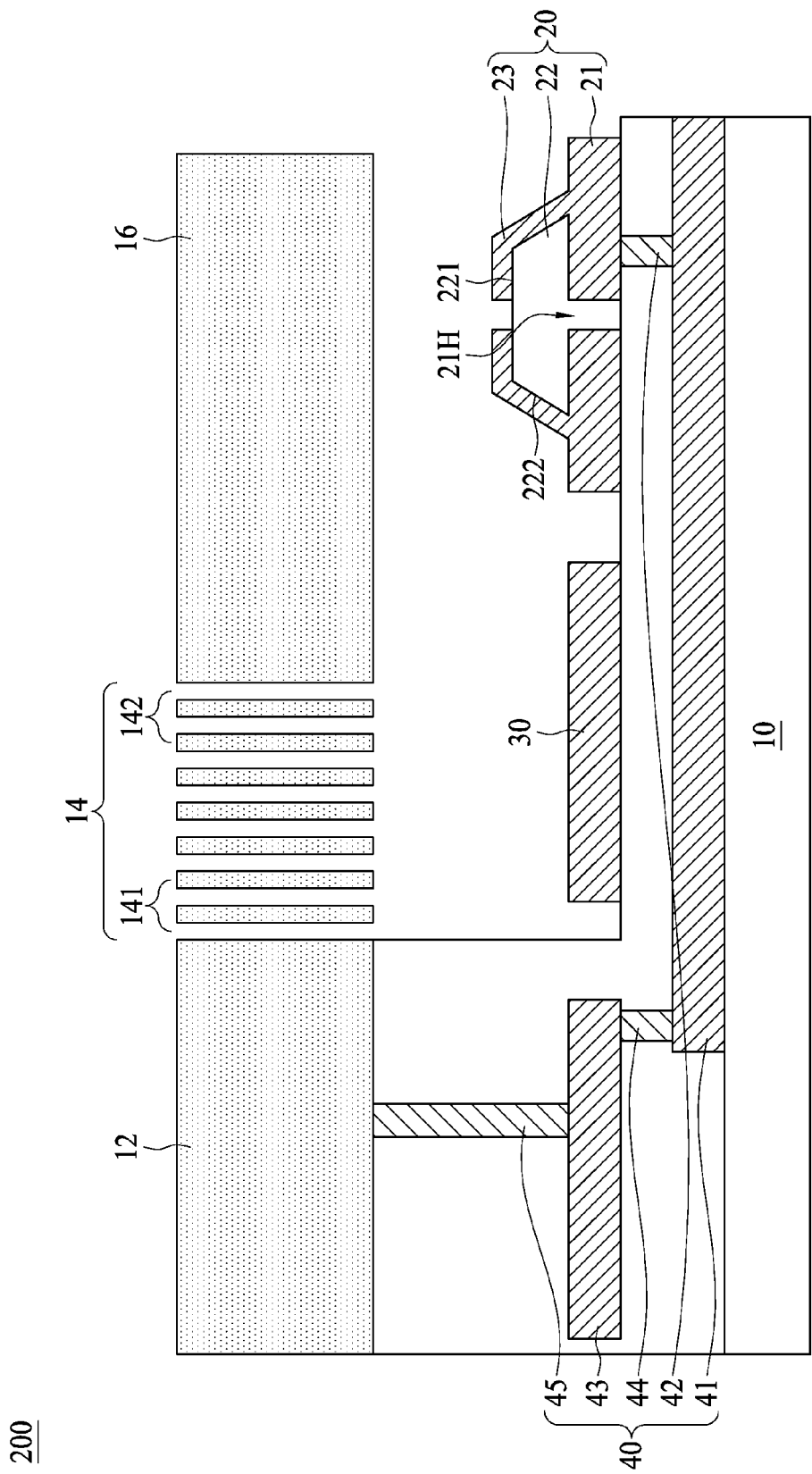
FIG. 5 is a schematic cross-sectional view of some embodiments of a device.

FIG. 5 is a schematic cross-sectional view of some embodiments of a device. As depicted in FIG. 5, one difference between the device 200 and the device 100 is that the device 200 further includes a connection feature 40 electrically connected to the third structure 16 and the bumper 20. In some embodiments, the connection feature 40 a first connection structure 41, a first conductive via 42, a second connection structure 43, a second conductive via 44 and a third conductive via 45. The first connection structure 41 is disposed over the substrate 10 and under the first conductive feature 21. The material of the first connection structure 41 includes conductive material e.g. metal, but not limited thereto. In some embodiments, the first connection structure and the first conductive feature 21 are electrically connected to each other through the first conductive via 42. The second connection structure 43 is disposed over the substrate 10. In some embodiments, second connection structure 43 is covered by the first structure 12. The material of the second connection structure 43 includes conductive material e.g. metal. In some embodiments, the second connection structure 43 is formed monolithically with first conductive feature 21. The second conductive via 44 is disposed between and electrically connected to the first connection structure 41 and the second connection structure 43. The third conductive via 45 is disposed be electrically connected to the second connection structure 43 and the first structure 12. The first, second and third conductive vias 42, 44 and 45 may be made of any suitable conductive material such as copper.

By virtue of the connection feature 40, the third structure 16 is able to be electrically connected to the bumper 20. As a result, when the third structure 16 contacts the bumper 20, the electrical charge between the third structure 16 and the bumper 20 can be equalized.

In the present disclosure, the device includes a suspended movable structure and a bumper is provided. The movable structure is suspended and able to move, swing or rotate when the device experiences a force. The bumper is a multi-layered bumper including a dielectric feature and a conductive feature enclosing the dielectric feature. The conductive feature provides a buffer effect when the movable structure contacts the bumper so as to avoid generation of particles. The dielectric feature provides a supporting effect when the movable structure contacts the bumper so as to avoid stiction.

In the present disclosure, a MEMS device including a spring, a proof mass and a bumper is provided. A portion of the proof mass and the bumper are spaced away, and the proof mass and the bumper are electrically connected to each other. When the proof mass contacts the bumper, electrical charges are equalized.

In one exemplary aspect, a device is provided. The device includes a substrate, a first structure, a second structure, a third structure and a bumper. The first structure is over the substrate. The second structure is over the substrate, wherein the second structure has a first end coupled to the first structure. The third structure is over the substrate, wherein the third structure is coupled to a second end of the second structure. The bumper is between the substrate and the third structure, wherein the bumper is a multi-layered bumper including a first conductive feature, a dielectric feature and a second conductive feature. The dielectric feature is over the first conductive feature. The second conductive feature is over the dielectric feature and electrically connected to the first conductive feature.

In another exemplary aspect, a MEMS device is provided. The MEMS device includes a substrate, a stationary structure, a proof mass, a spring and a bumper. The stationary structure is over the substrate, wherein the stationary structure exposes a portion of the substrate. The proof mass is over the substrate. The spring anchors the proof mass to the stationary structure. The bumper is between the substrate and the proof mass, wherein the bumper and the proof mass are electrically connected to each other.

In yet another exemplary aspect, a multi-layered structure formed over a substrate is provided. The multi-layered structure includes a bottom conductive feature, a dielectric feature and a top conductive film. The bottom conductive feature is over the substrate, and the bottom conductive feature has a recess exposing the substrate. The dielectric feature is on the bottom conductive feature, wherein a portion of the dielectric feature is in the recess. The top conductive film at least covers a portion of the dielectric feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
 a substrate;
 a first structure over the substrate;
 a second structure over the substrate, wherein the second structure has a first end coupled to the first structure;
 a third structure over the substrate, wherein the third structure is coupled to a second end of the second structure; and
 a bumper between the substrate and the third structure, wherein the bumper is a multi-layered bumper comprising:
  a first conductive feature;
  a dielectric feature over the first conductive feature; and
  a second conductive feature over the dielectric feature and electrically connected to the first conductive feature.

2. The device of claim 1, wherein the first conductive feature has a recess, the dielectric feature is disposed on the first conductive feature, a portion of the dielectric feature is in the recess, and the second conductive feature covers a portion of the dielectric feature.

3. The device of claim 2, wherein the dielectric feature has a top surface and a slanted sidewall, and the second conductive feature covers the slanted sidewall and a portion of the top surface of the dielectric feature.

4. The device of claim 1, wherein the second structure and the third structure are conductive.

5. The device of claim 4, further comprising a connection feature electrically connected to the third structure and the bumper.

6. The device of claim 5, wherein the connection feature comprises:
 a first connection structure over the substrate;
 a first conductive via electrically connected to the first conductive feature and the first connection structure;
 a second connection structure over the substrate;
 a second conductive via electrically connected to the first connection structure and the second connection structure; and
 a third conductive via electrically connected to the second connection structure and the first structure.

7. The device of claim 6, wherein the second connection structure of the connection feature and the first conductive feature of the bumper are formed of a same conductive layer.

8. The device of claim 1, wherein a material of the first conductive feature comprises metal.

9. The device of claim 1, wherein a material of the second conductive feature comprises metal.

10. The device of claim 1, wherein the first structure is a stationary structure, the second structure is a resilient structure, the third structure is a proof mass coupled to the resilient structure, and the resilient structure is configured to allow the proof mass to move toward or away from the substrate in a direction.

11. A MEMS device, comprising:
 a substrate;
 a stationary structure over the substrate, wherein the stationary structure exposes a portion of the substrate;
 a proof mass over the substrate;
 a spring anchoring the proof mass to the stationary structure; and
 a bumper between the substrate and the proof mass, wherein the bumper and the proof mass are electrically connected to each other.

12. The MEMS device of claim 11, wherein the bumper is a multi-layered bumper comprising:
 a dielectric feature over the substrate; and
 a top conductive film covering the dielectric feature.

13. The MEMS device of claim 12, wherein the dielectric feature has a top surface and a sidewall with a taper profile, and the top conductive film covers the sidewall and at least a portion of the top surface of the dielectric feature.

14. The MEMS device of claim 13, wherein the bumper further comprises a bottom conductive feature between the dielectric feature and the substrate.

15. The MEMS device of claim 14, wherein the bottom conductive feature is electrically coupled to the proof mass.

16. The MEMS device of claim 11, further comprising a plate over the substrate, wherein the proof mass and the plate form a capacitor.

17. The MEMS device of claim 11, wherein the bumper is disposed corresponding to an end of the proof mass distal to the spring.

18. A device, comprising:
 a substrate;
 a first structure over the substrate;
 a second structure over the substrate, wherein the second structure has a first end coupled to the first structure;
 a third structure over the substrate, wherein the third structure is coupled to a second end of the second structure; and
 a bumper between the substrate and the third structure, wherein the bumper is a multi-layered bumper comprising:
  a bottom conductive feature over the substrate, wherein the bottom conductive feature has a recess exposing the substrate;
  a dielectric feature on the bottom conductive feature, wherein a portion of the dielectric feature is in the recess; and
  a top conductive film at least covering a portion of the dielectric feature, and electrically connected to the bottom conductive feature.

19. The device of claim 18, wherein the dielectric feature has a top surface and a slanted sidewall, and the top conductive film covers the slanted sidewall and a portion of the top surface of the dielectric feature.

20. The device of claim 18, wherein the second structure and the third structure are conductive.

* * * * *